[12] United States Patent
Kishi et al.

(10) Patent No.: US 10,755,902 B2
(45) Date of Patent: Aug. 25, 2020

(54) PLASMA PROCESSING APPARATUS AND FOCUS RING

(71) Applicant: Tokyo Electron Limited, Tokyo (JP)

(72) Inventors: Hiroki Kishi, Miyagi (JP); Jisoo Suh, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 859 days.

(21) Appl. No.: 15/164,039

(22) Filed: May 25, 2016

(65) Prior Publication Data

US 2016/0351378 A1 Dec. 1, 2016

(30) Foreign Application Priority Data

May 27, 2015 (JP) .................. 2015-107488
Nov. 2, 2015 (JP) .................. 2015-216003

(51) Int. Cl.
*H01J 37/32* (2006.01)
*H01L 21/687* (2006.01)
*H01L 21/683* (2006.01)
*H01L 21/3065* (2006.01)
*H01L 21/67* (2006.01)
(Continued)

(52) U.S. Cl.
CPC .... *H01J 37/32642* (2013.01); *H01L 21/3065* (2013.01); *H01L 21/6831* (2013.01); *H01L 21/68735* (2013.01); *H01L 21/02315* (2013.01); *H01L 21/32136* (2013.01);
(Continued)

(58) Field of Classification Search
CPC .......... H01J 37/32642; H01J 2237/334; H01L 21/6831; H01L 21/68735; H01L 21/67109; H01L 21/67069; H01L 21/6835; H01L 21/32136; H01L 21/3065; H01L 21/02315; H05H 1/46
See application file for complete search history.

(56) References Cited

U.S. PATENT DOCUMENTS 5,262,029 A * 11/1993 Erskine ............... C23C 16/4585
118/503
5,529,657 A * 6/1996 Ishii ..................... H01J 37/321
156/345.26
(Continued)

FOREIGN PATENT DOCUMENTS

CN 101303997 A 11/2008
CN 102007572 A 4/2011
(Continued)

*Primary Examiner* — Jeffrie R Lund
(74) *Attorney, Agent, or Firm* — Pearne & Gordon LLP

(57) ABSTRACT

A plasma processing apparatus includes a chamber, a mounting table 2 and a focus ring 8. The chamber is configured to process a semiconductor wafer W with plasma. The mounting table 2 is provided within the chamber, and includes a holding surface 9a on which the semiconductor wafer W is mounted. The focus ring 8 is provided to surround the semiconductor wafer W mounted on the holding surface 9a, and includes a first flat portion 8a, a second flat portion 8b and a third flat portion 8c which are formed in sequence from an inner circumferential side of the focus ring 8 toward an outer circumferential side thereof. Here, the first flat portion 8a is lower than the holding surface 9a, the second flat portion 8b is lower than the first flat portion 8a, and the third flat portion 8c is higher than the first flat portion 8a.

20 Claims, 7 Drawing Sheets

(51) Int. Cl.
*H05H 1/46* (2006.01)
*H01L 21/02* (2006.01)
*H01L 21/3213* (2006.01)

(52) U.S. Cl.
CPC .. *H01L 21/67069* (2013.01); *H01L 21/67109* (2013.01); *H01L 21/6835* (2013.01); *H05H 1/46* (2013.01)

(56) References Cited

U.S. PATENT DOCUMENTS

| | | | | |
|---|---|---|---|---|
| 5,673,922 | A * | 10/1997 | Sherstinsky | B23Q 3/186 118/728 |
| 5,942,039 | A * | 8/1999 | Kholodenko | H01J 37/32642 118/723 E |
| 6,284,093 | B1 * | 9/2001 | Ke | H01J 37/32623 156/345.51 |
| 6,344,105 | B1 * | 2/2002 | Daugherty | H01J 37/32623 156/345.51 |
| 6,464,794 | B1 * | 10/2002 | Park | C23C 16/4583 118/724 |
| 7,713,380 | B2 * | 5/2010 | Chen | H01J 37/3244 118/723 R |
| 7,727,354 | B2 * | 6/2010 | Park | H01J 37/32495 118/723 E |
| 7,988,814 | B2 * | 8/2011 | Koshiishi | H01J 37/32642 118/723 E |
| 8,702,903 | B2 * | 4/2014 | Miyagawa | H01J 37/32091 118/728 |
| 9,252,039 | B2 * | 2/2016 | Shiraiwa | H01L 21/6831 |
| 9,761,418 | B2 * | 9/2017 | Shintaku | H01J 37/32275 |
| 10,304,718 | B2 * | 5/2019 | Shiraiwa | H01L 21/6831 |
| 2004/0261946 | A1 | 12/2004 | Endoh | |
| 2007/0173059 | A1 * | 7/2007 | Young | C23C 14/3407 438/648 |
| 2008/0087382 | A1 * | 4/2008 | Sugiyama | H01J 37/32495 156/345.51 |
| 2008/0236749 | A1 * | 10/2008 | Koshimizu | H01J 37/32091 156/345.33 |
| 2009/0117746 | A1 * | 5/2009 | Masuda | C23C 16/45561 438/710 |
| 2009/0236043 | A1 * | 9/2009 | Matsudo | H01J 37/32091 156/345.43 |
| 2010/0041240 | A1 * | 2/2010 | Tsujimoto | H01J 37/32642 438/758 |
| 2010/0213171 | A1 * | 8/2010 | Koshimizu | H01J 37/32091 216/67 |
| 2011/0126984 | A1 * | 6/2011 | Kang | H01J 37/32091 156/345.51 |
| 2012/0176692 | A1 * | 7/2012 | Yamawaku | H01J 37/32724 359/825 |
| 2014/0127911 | A1 * | 5/2014 | Shih | H01J 37/32477 438/710 |
| 2014/0146434 | A1 * | 5/2014 | Uchida | H01L 21/6831 361/234 |
| 2014/0202631 | A1 * | 7/2014 | Kanbara | H01J 37/32091 156/285 |
| 2015/0114567 | A1 * | 4/2015 | Nagayama | H01J 37/32091 156/345.52 |
| 2015/0140828 | A1 * | 5/2015 | Urakawa | H01J 37/32091 438/714 |
| 2015/0162170 | A1 * | 6/2015 | Kishi | H01J 37/32642 156/345.51 |
| 2015/0168130 | A1 * | 6/2015 | Matsudo | H01J 37/3288 156/345.24 |
| 2016/0079074 | A1 * | 3/2016 | Toyoda | H01L 21/31116 438/5 |
| 2016/0126064 | A1 * | 5/2016 | Yamawaku | H01J 37/3211 216/67 |
| 2016/0189994 | A1 * | 6/2016 | Sasaki | H01L 21/6833 361/234 |
| 2016/0216185 | A1 * | 7/2016 | Gottscho | G01N 3/56 |
| 2016/0351378 | A1 * | 12/2016 | Kishi | H01J 37/32642 |
| 2017/0032987 | A1 * | 2/2017 | Lee | H01J 37/32009 |
| 2017/0287764 | A1 * | 10/2017 | Kouno | H01L 21/3065 |

FOREIGN PATENT DOCUMENTS

| | | |
|---|---|---|
| JP | 3166974 U | 3/2011 |
| JP | 2014-220502 A | 11/2014 |
| KR | 101489828 B1 * | 2/2015 |
| WO | 2009/154853 A2 | 12/2009 |

* cited by examiner

PLASMA PROCESSING APPARATUS AND FOCUS RING

CROSS-REFERENCE TO RELATED APPLICATION

This application claims the benefit of Japanese Patent Application Nos. 2015-107488 and 2015-216003 filed on May 27, 2015 and Nov. 2, 2015, respectively, the entire disclosures of which are incorporated herein by reference.

TECHNICAL FIELD

The embodiments described herein pertain generally to a plasma processing apparatus and a focus ring.

BACKGROUND

Conventionally, in a plasma processing apparatus, a processing target object is mounted on a mounting table which is provided within a chamber. The mounting table is equipped with a conductive edge ring (also referred to as a focus ring) which surrounds the processing target object mounted on the mounting table. As such a focus ring, there is known a focus ring including a first flat portion lower than a mounting surface of the mounting table; and a second flat portion higher than the first flat portion and a processing target surface of the processing target object (see, for example, Patent Document 1). The first flat portion and the second flat portion are formed in sequence from an inner circumferential side of the focus ring toward an outer circumferential side thereof.

Patent Document 1: Japanese Registered Utility Model Publication No. 3,166,974

As, however, processes upon processing target objects are repeated, the focus ring is consumed. If the focus ring is consumed, a shape of the focus ring is changed. Thus, a height relationship between a plasma sheath formed above the focus ring and a plasma sheath formed above the processing target object is also changed. Accordingly, the consumption of the focus ring causes a variation in an incident angle of particles in plasma, such as ions, upon the processing target object.

If a variance in the incident angle of the particles, such as the ions, in the plasma upon the processing target object is increased as a result of the consumption of the focus ring, it is difficult to suppress non-uniformity in an inclination of a hole within a preset range. Thus, the focus ring needs to be replaced before the non-uniformity in the inclination of the hole exceeds the preset range. In case that the focus ring is frequently replaced, however, a process is required to be stopped every time the focus ring is replaced, so that a throughput of the process is reduced.

SUMMARY

According to an exemplary embodiment, a plasma processing apparatus includes a chamber, a mounting table and a focus ring. The chamber is configured to process therein a processing target object with plasma. The mounting table is provided within the chamber, and includes a mounting surface on which the processing target object is mounted. The focus ring is provided to surround the processing target object mounted on the mounting surface, and includes a first flat portion lower than the mounting surface, a second flat portion lower than the first flat portion and a third flat portion higher than the first flat portion, which are formed in sequence from an inner circumferential side of the focus ring toward an outer circumferential side thereof.

In one exemplary embodiment, a plasma processing apparatus includes a chamber in which a processing target object is processed with plasma; a mounting table, provided within the chamber, including a mounting surface on which the processing target object is mounted; and a focus ring, provided to surround the processing target object mounted on the mounting surface, including a first flat portion, a second flat portion and a third flat portion which are formed in sequence from an inner circumferential side of the focus ring toward an outer circumferential side thereof. Here, the first flat portion is lower than the mounting surface, the second flat portion is lower than the first flat portion, and the third flat portion is higher than the first flat portion.

An inclined surface which declines from the inner circumferential side of the focus ring toward the outer circumferential side thereof may be formed between the first flat portion and the second flat portion.

Further, an inclined surface which ascends from the inner circumferential side of the focus ring toward the outer circumferential side thereof may be formed between the second flat portion and the third flat portion.

Moreover, a wall surface portion extended from the second flat portion up to a position having a first height in a thickness direction of the focus ring may be formed between the second flat portion and the third flat portion, and the inclined surface may be formed between the position having the first height and the third flat portion.

Furthermore, the first height may be equal to or higher than a height from the second flat portion to the first flat portion.

Further, a width of the first flat portion may be smaller than a width of the second flat portion in a radial direction of the focus ring.

Moreover, the width of the second flat portion may be smaller than a width of the third flat portion in the radial direction of the focus ring.

The third flat portion may be provided at a position higher than a processing target surface of the processing target object which is mounted on the mounting table.

The first flat portion may be provided at a position lower than the mounting surface of the mounting table.

In another exemplary embodiment, a focus ring provided within a chamber, in which a processing target object is processed with plasma, and positioned to surround the processing target object mounted on a mounting surface of a mounting table includes a first flat portion lower than the mounting surface; a second flat portion lower than the first flat portion; and a third flat portion higher than the first flat portion. Here, the first flat portion, the second flat portion and the third flat portion are formed in sequence from an inner circumferential side of the focus ring toward an outer circumferential side thereof.

An inclined surface which declines from the inner circumferential side of the focus ring toward the outer circumferential side thereof may be formed between the first flat portion and the second flat portion.

Further, an inclined surface which ascends from the inner circumferential side of the focus ring toward the outer circumferential side thereof may be formed between the second flat portion and the third flat portion.

Moreover, a wall surface portion extended from the second flat portion up to a position having a first height in a thickness direction of the focus ring may be formed between the second flat portion and the third flat portion, and the inclined surface may be formed between the position having the first height and the third flat portion.

Furthermore, the first height may be equal to or higher than a height from the second flat portion to the first flat portion.

Further, a width of the first flat portion may be smaller than a width of the second flat portion in a radial direction of the focus ring.

Moreover, the width of the second flat portion may be smaller than a width of the third flat portion in the radial direction of the focus ring.

The third flat portion may be provided at a position higher than a processing target surface of the processing target object which is mounted on the mounting table.

The first flat portion may be provided at a position lower than the mounting surface of the mounting table.

According to the exemplary embodiments, the variation in the hole inclination that might be caused by the consumption of the focus ring can be suppressed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following, a plasma processing apparatus and a focus ring according to exemplary embodiments will be described in detail, and reference is made to the accompanying drawings, which form a part of the description. Here, however, it should be noted that the exemplary embodiments described herein are not meant to be anyway limiting. The various exemplary embodiments can be appropriately combined as long as the contents of processes are not contradictory.

[Configuration of Plasma Processing Apparatus 100]

Figure 1:
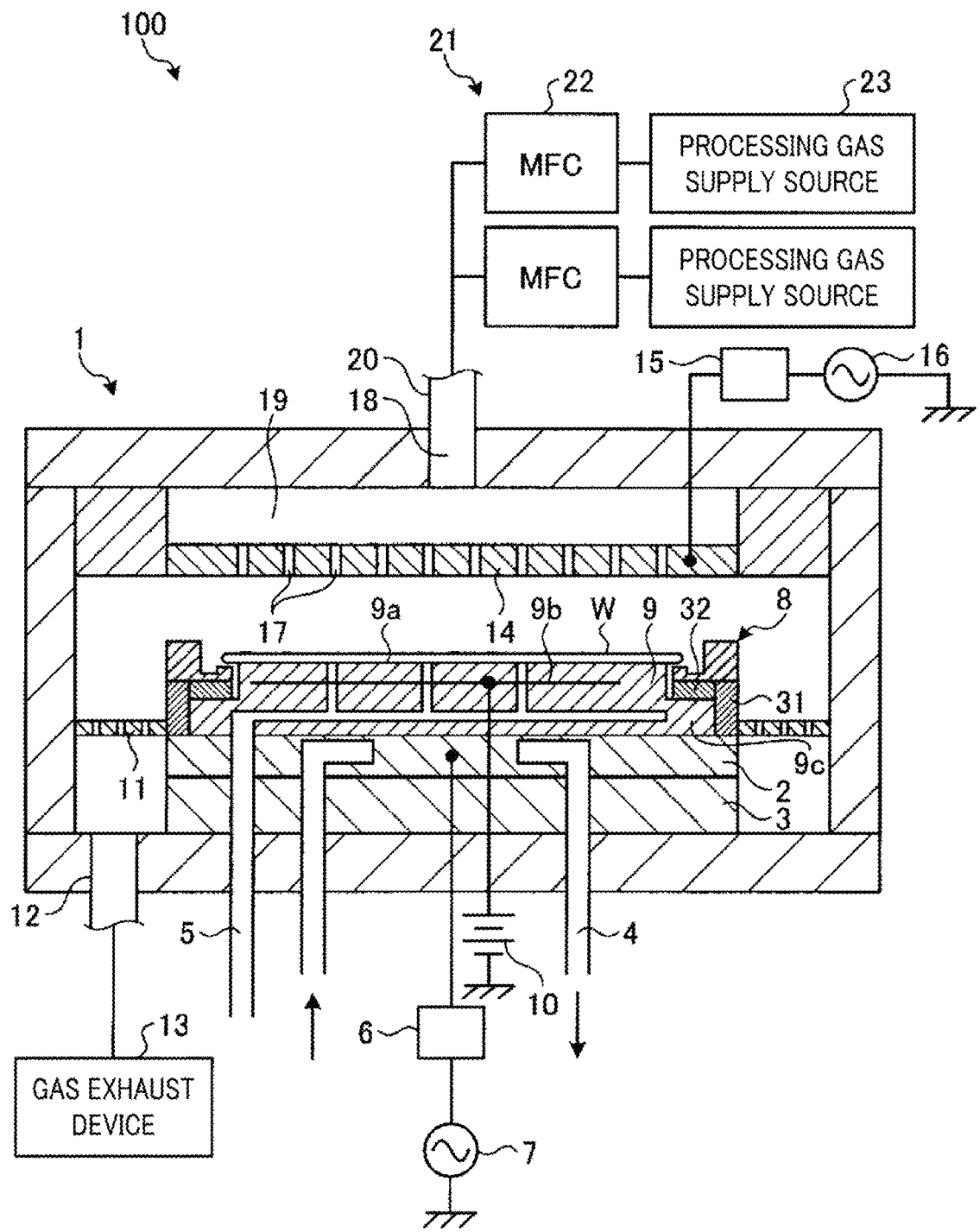
FIG. 1 is a cross sectional view schematically illustrating an overall configuration of a plasma processing apparatus.

FIG. 1 is a cross sectional view schematically illustrating an overall configuration of a plasma processing apparatus 100. As depicted in FIG. 1, the plasma processing apparatus 100 includes a cylindrical chamber 1 configured as a processing chamber which can be hermetically sealed. The chamber 1 is made of, by way of non-limiting example, aluminum. Provided within the chamber 1 is a mounting table 2 configured to mount thereon a semiconductor wafer W as a processing target object. The mounting table 2 serves as a lower electrode. Further, the mounting table 2 is made of a conductive material such as, but not limited to, aluminum and has a block shape.

The mounting table 2 is supported on an insulating plate 3 such as ceramic within the chamber 1. An electrostatic chuck 9 configured to attract the semiconductor wafer W is provided on a top surface of the mounting table 2. The electrostatic chuck 9 is made of an insulator and has an electrode 9b therein. The electrode 9b is connected to a DC power supply 10. The electrostatic chuck 9 has, on a top surface thereof, a holding surface 9a configured to hold the semiconductor wafer W thereon. The electrostatic chuck 9 is configured to attract and hold the semiconductor wafer W on the holding surface 9a by a Coulomb force generated by a DC voltage applied to the electrode 9b from the DC power supply 10.

The holding surface 9a of the electrostatic chuck 9 corresponds to a mounting surface of the mounting table 2. Thus, in the following description, the electrostatic chuck 9, an insulating member 31, a conductive member 32 and the mounting table 2 will be appropriately referred to as "mounting table 2," and the mounting surface of the mounting table 2 will be appropriately referred to as "holding surface 9a of the electrostatic chuck 9."

The electrostatic chuck 9 is provided with a peripheral shoulder portion 9c at a periphery thereof. A top surface of the peripheral shoulder portion 9c is lower than the holding surface 9a. The insulating member 31 made of, for example, quartz is provided on a side surface of the peripheral shoulder portion 9c of the electrostatic chuck 9. Further, the conductive member 32 made of, for example, aluminum is provided on a top surface of the peripheral shoulder portion 9c of the electrostatic chuck 9.

Furthermore, a fluid flow path 4 through which an insulating fluid as a heat medium for temperature control is circulated and a gas flow path 5 through which a temperature control gas such as a helium gas is supplied to a rear surface of the semiconductor wafer W are formed within the mounting table 2. By circulating the insulating fluid regulated to a preset temperature through the fluid flow path 4, the mounting table 2 is set to have a predetermined temperature. Further, by supplying the temperature control gas to a gap between the mounting table 2 and the semiconductor wafer W through the gas flow path 5, the heat exchange between the mounting table 2 and the semiconductor wafer W is accelerated, so that the mounting table 2 is capable of controlling the semiconductor wafer W mounted on the mounting surface to have the predetermined temperature accurately and efficiently.

The mounting table 2 is connected to a high frequency power supply 7 via a matching device 6. The high frequency power supply 7 is configured to supply a high frequency power of a preset frequency to the mounting table 2 via the matching device 6.

Further, as depicted in FIG. 1, the plasma processing apparatus 100 includes a focus ring 8 which is provided around the mounting table 2 to surround the semiconductor wafer W mounted on the mounting surface of the mounting table 2, i.e., on the holding surface 9a of the electrostatic chuck 9. The focus ring 8 has a ring shape and is made of a conductive material such as, but not limited to, silicon, carbon or SiC.

Furthermore, an annular gas exhaust ring 11 is provided at an outside of the focus ring 8. The gas exhaust ring 11 is provided with a multiple number of gas exhaust holes. A processing space within the chamber 1 is evacuated by a gas exhaust device 13 such as a vacuum pump which is connected to a gas exhaust port 12 via the gas exhaust ring 11.

Meanwhile, provided at a ceiling portion of the chamber 1 above the mounting table 2 is a shower head 14 which faces the mounting table 2. The shower head 14 and the mounting table 2 serve as a pair of electrodes (upper electrode and lower electrode). Further, the shower head 14 is connected to a high frequency power supply 16 via a matching device 15.

A multiple number of gas discharge holes 17 is formed through a bottom surface of the shower head 14, and a gas inlet opening 18 is formed at an upper portion of the shower head 14. A gas diffusion space 19 is formed within the shower head 14. One end of a gas supply line 20 is connected to the gas inlet opening 18, and the other end of the gas supply line 20 is connected to a gas supply system 21. The gas supply system 21 includes a mass flow controller (MFC) 22 configured to control a gas flow rate and a processing gas supply source 23 configured to supply, for example, a processing gas for etching.

[Details of Focus Ring 8]

Figure 2:
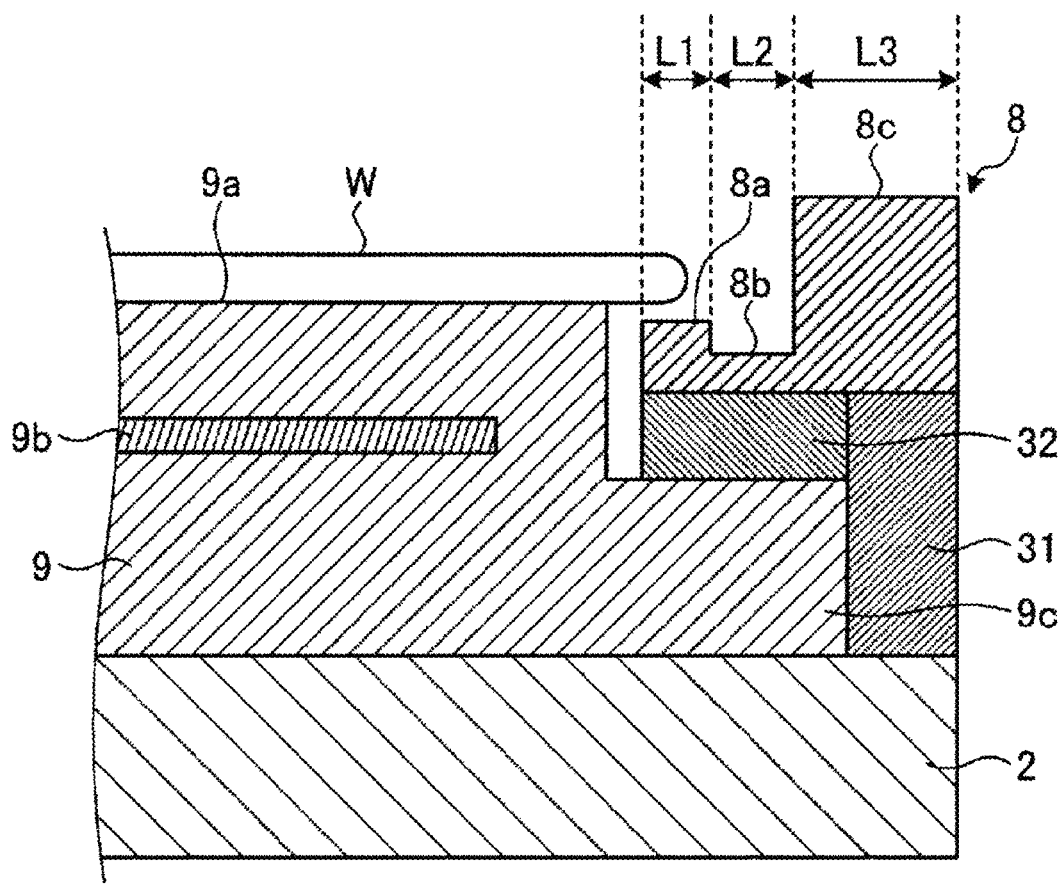
FIG. 2 is an enlarged cross sectional view schematically illustrating a positional relationship between a focus ring, a semiconductor wafer, an electrostatic chuck and a mounting table.

Now, the focus ring 8 shown in FIG. 1 will be further elaborated with reference to FIG. 2. FIG. 2 is an enlarged cross sectional view schematically illustrating a positional relationship between the focus ring 8, the semiconductor wafer W, the electrostatic chuck 9 and the mounting table 2.

By way of example, as illustrated in FIG. 2, the focus ring 8 includes a first flat portion 8a, a second flat portion 8b and a third flat portion 8c which are formed in sequence from an inner circumferential side (left side of FIG. 2) of the focus ring 8 toward an outer circumferential side (right side of FIG. 2) thereof. The first flat portion 8a is provided at a position lower than the mounting surface of the mounting table 2, i.e., the holding surface 9a of the electrostatic chuck 9, and a part of the first flat portion 8a is located under the semiconductor wafer W. The second flat portion 8b is provided at a position lower than the first flat portion 8a. The third flat portion 8c is provided at a position higher than the first flat portion 8a. In the present exemplary embodiment, the third flat portion 8c is located at a position higher than the processing target surface of the semiconductor wafer W which is mounted on the holding surface 9a of the electrostatic chuck 9.

Furthermore, in the focus ring 8 according to the present exemplary embodiment, a width L1 of the first flat portion 8a is smaller than a width L2 of the second flat portion 8b in a radial direction (left-right direction of FIG. 2) of the focus ring 8. Further, the width L2 of the second flat portion 8b is smaller than a width L3 of the third flat portion 8c in the radial direction of the focus ring 8.

Figure 3A:
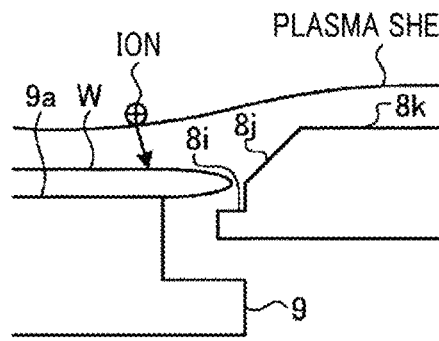
FIG. 3A and FIG. 3B are diagrams for describing a variation in an incident angle of ions which is caused by consumption of a conventional focus ring.
Figure 3B:
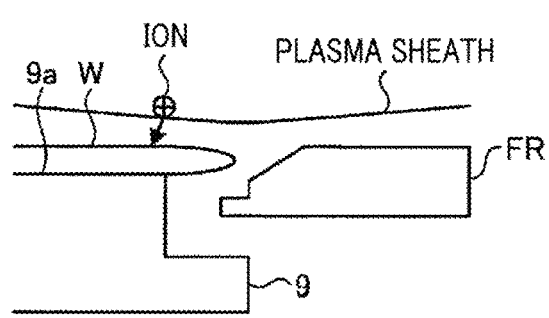
Figure 4A:
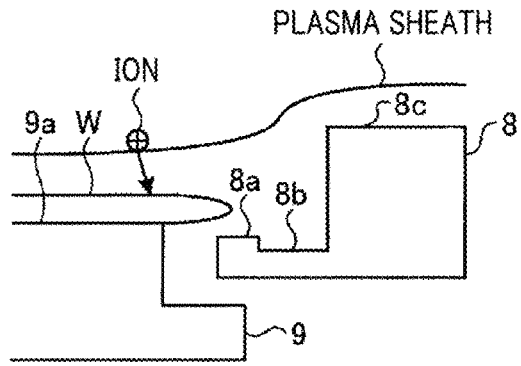
FIG. 4A and FIG. 4B are diagrams for describing a variation in an incident angle of ions which is caused by consumption of a focus ring according to an exemplary embodiment.
Figure 4B:
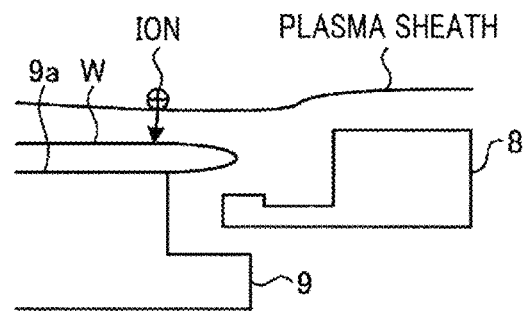

Here, the reason why the first flat portion 8a, the second flat portion 8b and the third flat portion 8c are formed in the focus ring 8 will be discussed while comparing the focus ring 8 according to the exemplary embodiment with a conventional focus ring FR. FIG. 3A and FIG. 3B are diagrams for describing a variation in an incident angle of ions, which is caused by consumption of the conventional focus ring FR. FIG. 4A and FIG. 4B are diagrams for describing a variation in an incident angle of ions, which is caused by consumption of the focus ring 8 according to the present exemplary embodiment. Further, in the focus ring FR shown in FIG. 3A and FIG. 3B, a first flat surface 8i lower than the mounting surface of the mounting table 2, i.e., the holding surface 9a of the electrostatic chuck 9 and a second flat surface 8k higher than the processing target surface of the semiconductor wafer W are formed in sequence from an inner circumferential side of the focus ring FR toward an outer circumferential side thereof. In addition, an inclined surface 8j which ascends from the inner circumferential side toward the outer circumferential side of the focus ring FR is formed between the first flat surface 8i and the second flat surface 8k.

The conventional focus ring FR will be first explained with reference to FIG. 3A and FIG. 3B. In case that the focus ring FR is not consumed, a plasma sheath above the focus ring FR is formed at a position higher than a plasma sheath formed above the semiconductor wafer W, as illustrated in FIG. 3A. In this case, in the vicinity of a peripheral portion of a semiconductor wafer W, ions in plasma reach the processing target surface of the semiconductor wafer W slantly in a direction from a central portion of the processing target surface toward a peripheral portion thereof. Accordingly, a hole formed in the vicinity of the peripheral portion of the processing target surface of the semiconductor wafer W is inclined toward the peripheral portion of the processing target surface of the semiconductor wafer W with respect to a vertical direction.

As the focus ring FR is consumed by the plasma, the height of the focus ring FR decreases. Accordingly, the position of the plasma sheath above the focus ring FR is also lowered, as illustrated in FIG. 3B, for example, so that the position of the plasma sheath formed above the peripheral portion of the semiconductor wafer W becomes lower than the position of the plasma sheath formed above the central portion of the semiconductor wafer W. As a result, in the vicinity of the peripheral portion of the semiconductor wafer W, the ions in the plasma reach the processing target surface slantly in the direction from the peripheral portion of the processing target surface of the semiconductor wafer W toward the central portion thereof. Accordingly, a hole formed in the vicinity of the peripheral portion of the processing target surface of the semiconductor wafer W is inclined toward the central portion of the processing target surface of the semiconductor wafer W with respect to the vertical direction.

With regard to the conventional focus ring FR, in the plasma sheath distribution shown in FIG. 3A, the hole formed in the vicinity of the peripheral portion of the processing target surface of the semiconductor wafer W is inclined at an angle of, e.g., 1° toward the peripheral portion of the processing target surface of the semiconductor wafer W with respect to the vertical direction. Further, in the plasma sheath distribution shown in FIG. 3B, the hole formed in the vicinity of the peripheral portion of the processing target surface of the semiconductor wafer W is inclined at an angle of, e.g., 1° toward the central portion of the processing target surface of the semiconductor wafer W with respect to the vertical direction. In this case, if the angle toward the peripheral portion of the processing target surface of the semiconductor wafer W is set to be a positive angle, a variance of the inclination of the hole amounts to 1°−(−1°)=2° when the focus ring is consumed in a preset amount.

Now, referring to FIG. 4A and FIG. 4B, the focus ring 8 according to the exemplary embodiment will be elaborated. In case that the focus ring 8 is not consumed, the plasma sheath above the focus ring 8 is formed at a position higher than the plasma sheath formed above a semiconductor wafer W, as illustrated in FIG. 4A. In the vicinity of the peripheral portion of the processing target surface of the semiconductor wafer W, ions in plasma reach the processing target surface of the semiconductor wafer W slantly in a direction from the central portion of the processing target surface of the semiconductor wafer W toward the peripheral portion thereof. Accordingly, the hole formed in the vicinity of the peripheral portion of the processing target surface of the semiconductor wafer W is inclined toward the peripheral portion of the processing target surface of the semiconductor wafer W with respect to the vertical direction. Further, for the comparison with FIG. 3A, it is assumed that the focus ring 8 in FIG. 4A has a shape in which an inclination of the hole formed in the vicinity of the peripheral portion of the semiconductor wafer W is the same as an inclination of the hole shown in FIG. 3A when the focus ring 8 is not consumed.

If the focus ring 8 is consumed by the plasma in the same amount (level) as the conventional focus ring FR shown in FIG. 3B, the height of the third flat portion 8c is lowered as illustrated in FIG. 4B, for example. Accordingly, as depicted in FIG. 4B, for example, the position of the plasma sheath formed above the third flat portion 8c is lowered. As a result, in the vicinity of the peripheral portion of the semiconductor wafer W, ions in the plasma reach the processing target surface of the semiconductor wafer W slantly in the direction from the peripheral portion of the processing target surface of the semiconductor wafer W toward the central portion thereof. Accordingly, the hole formed in the vicinity of the peripheral portion of the processing target surface of the semiconductor wafer W is inclined toward the central portion of the processing target surface of the semiconductor wafer W with respect to the vertical direction.

Here, although the focus ring 8 according to the exemplary embodiment is consumed in overall by the plasma, the cross sectional shape of the focus ring 8 is maintained. Thus, in the focus ring 8 according to the present example embodiment, even if the focus ring 8 is consumed by the plasma, the plasma sheath distribution in which the plasma sheath above the second flat portion 8b is low and the plasma sheath above the third flat portion 8c is high is still maintained. Therefore, even if the focus ring 8 is consumed in the same amount as the conventional focus ring FR, in the vicinity of the peripheral portion of the semiconductor wafer W, the incident angle of the ions in the plasma in the direction from the peripheral portion of the processing target surface of the semiconductor wafer W toward the central portion thereof becomes smaller than that in case of the conventional focus ring FR.

In the focus ring 8 according to the present exemplary embodiment, if the focus ring 8 is not consumed by the plasma, the shape of the hole formed in the vicinity of the peripheral portion of the semiconductor wafer W is inclined toward the peripheral portion of the semiconductor wafer W at an angel of, e.g., 1°. If the consumption amount of the focus ring 8 by the plasma becomes the same level as the consumption amount of the conventional focus ring FR shown in FIG. 3B, the shape of the hole is inclined toward the central portion of the semiconductor wafer W at an angel of, e.g., 0.5°, as illustrated in FIG. 4B. As a result, if the focus ring 8 is consumed in the preset amount, a variance in the inclination of the hole amounts to 1°−(−0.5°)=1.5°.

As stated above, in the focus ring 8 according to the present exemplary embodiment, the first flat portion 8a, the second flat portion 8b and the third flat portion 8c are formed in sequence from the inner circumferential side of the focus ring 8 toward the outer circumferential side thereof. Further, the second flat portion 8b is lower than the first flat portion 8a, and the third flat portion 8c is higher than the first flat portion 8a. With this configuration, even in case that the focus ring 8 is consumed by the plasma, the variation in the distribution of the plasma sheath formed above the processing target surface of the semiconductor wafer W can be reduced. Accordingly, the variance in the inclination of the hole formed on the processing target surface of the semiconductor wafer W can be reduced, as compared to the case of using the conventional focus ring FR. Therefore, frequency of the replacement of the focus ring 8 can be reduced, so that throughput of process can be improved.

[Simulation Result]

Figure 5:
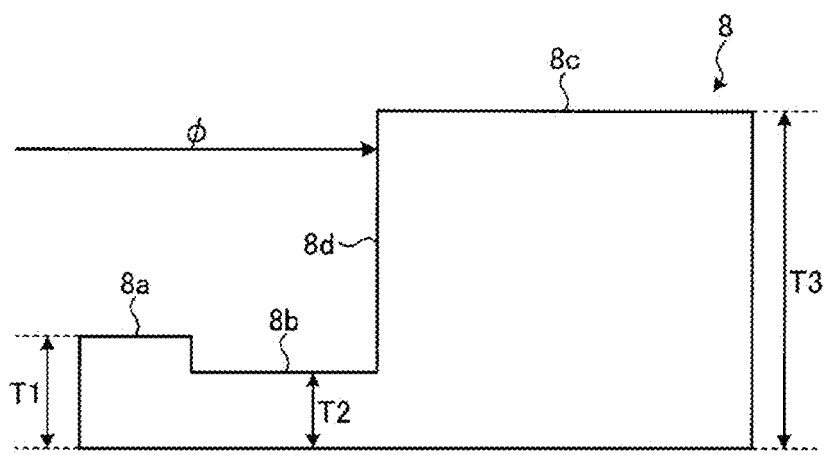
FIG. 5 is a cross sectional view illustrating an example of a focus ring according to the exemplary embodiment.

Now, there will be described a result of a simulation conducted to investigate a relationship between an improvement rate of the incident angle of ions and the thickness of the second flat portion 8b, the thickness of the third flat portion 8c, and the like. FIG. 5 is a cross sectional view illustrating an example of the focus ring according to the exemplary embodiment. In the simulation, a thickness of the focus ring 8 at the first flat portion 8a is defined as T1; a thickness of the focus ring 8 at the second flat portion 8b, T2; and a thickness of the focus ring 8 at the third flat portion 8c, T3, as shown in FIG. 5. Further, as illustrated in FIG. 5, a distance from a center of a circle drawn by the inner circumferential surface of the focus ring 8 to a wall surface 8d formed between the second flat portion 8b and the third flat portion 8c is defined as φ.

Further, in the present exemplary embodiment, an improvement rate I (%) of a variance in the inclination of the hole when using the focus ring 8 is defined to be I={(θ1/θ2)−1}×100. Here, θ1 denotes a variance in the inclination of the hole in case of using the focus ring as a reference, and θ2 represents a variance in the inclination of the hole in case of using the focus ring 8. As the focus ring as the reference, the conventional focus ring FR illustrated in FIG. 3A and FIG. 3B is used.

Figure 6:
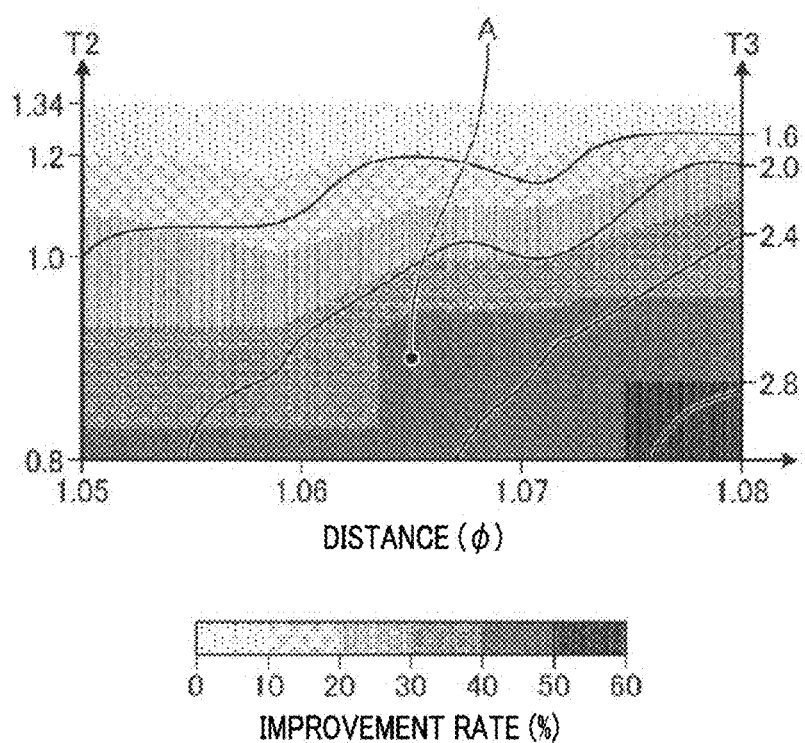
FIG. 6 is a diagram showing an example of a simulation result regarding a relationship between an improvement rate of a variance in an inclination of a hole and a thickness of a second flat portion, a thickness of a third flat portion and a distance from a center of the focus ring to a wall surface thereof.

FIG. 6 is a diagram illustrating an example of the simulation result regarding the relationship between the improvement rate I of the variance in the inclination of the hole and the thickness T2 of the second flat portion 8b, the thickness T3 of the third flat portion 8c and the distance φ from the center of the focus ring 8 to the wall surface 8d. In FIG. 6, a vertical axis on the left indicates the thickness T2 of the second flat portion 8b, and a vertical axis on the right indicates the thickness T3 of the third flat portion 8c. In both cases, thickness values on the vertical axis are indicated as ratios with respect to the thickness T1 of the first flat portion 8a. Further, solid lines in FIG. 6 indicate the thickness T3 of the third flat portion 8c. Moreover, In FIG. 6, a horizontal axis represents the distance φ from the center of the focus ring 8 to the wall surface 8d, and distance values on the horizontal axis are ratios with respect to an inner radius of the focus ring 8. In addition, in FIG. 6, the improvement rate I of the variance in the inclination of the hole are indicated by different hatchings for preset value ranges.

Referring to the simulation result shown in FIG. 6, at a point A where the thickness T2 of the second flat portion 8b is about 0.9 times as large as the thickness T1 of the first flat portion 8a, the distance φ from the center of the focus ring 8 to the wall surface 8d is about 1.065, and the thickness T3 of the third flat portion 8c is about 2.2 times as large as the thickness T1 of the first flat portion 8a, for example, the improvement rate I of the variance in the hole inclination is found to be in the range from 40% to 50%.

As clearly seen from the simulation result shown in FIG. 6, as it goes from the top to the bottom of FIG. 6, i.e., as the thickness T2 of the second flat portion 8b decreases, the improvement rate I of the variance in the hole inclination is found to be increased. Further, for example, it is also found out that the improvement rate I of the variance in the hole inclination can be set to be 40% or higher if the thickness T2 of the second flat portion 8b is smaller than the thickness T1 of the first flat portion 8a, i.e., if the position of the second flat portion 8b is lower than the position of the first flat portion 8a.

As stated above, in the focus ring 8 having the shape shown in FIG. 1 and FIG. 2, by setting the position of the second flat portion 8b to be lower than the position of the first flat portion 8a, the improvement rate I of the variance in the hole inclination can be set to be equal to or higher than 40%.

Moreover, as clearly seen from the simulation result shown in FIG. 6, the improvement rate I of the variance in the hole inclination is also found to be improved as it goes from the left upper side to the right lower side of FIG. 6, i.e., as the distance φ from the center of the focus ring 8 to the wall surface 8d increases and the thickness T3 of the third flat portion 8c increases with respect to the thickness T1 of the first flat portion 8a. Further, for example, if the thickness T2 of the second flat portion 8b is smaller than the thickness T1 of the first flat portion 8a, the improvement rate I of the variance in the hole inclination can be set to be 40%. Furthermore, for another example, it is also found out that the improvement rate I of the variance in the hole inclination can be set to be equal to or higher than 40% if the thickness T2 of the second flat portion 8b is smaller than the thickness T1 of the first flat portion 8a, the distance φ from the center of the focus ring 8 to the wall surface 8d is longer than about 1.065 and the thickness T3 of the third flat portion 8c is equal to or larger than about 2.2 times of the thickness T1 of the first flat portion 8a.

As discussed above, in the focus ring 8 having the shape shown in FIG. 1 and FIG. 2, by setting the thickness T2 of the second flat portion 8b to be smaller than the thickness T1 of the first flat portion 8a, setting the distance φ from the center of the focus ring 8 to the wall surface 8d to be longer than about 1.065 and setting the thickness T3 of the third flat portion 8c to be equal to or larger than about 2.2 times of the thickness T1 of the first flat portion 8a, it is possible to set the improvement rate I of the variance in the hole inclination to be equal to or higher than 40%.

So far, the exemplary embodiment has been described. As clearly can be seen from the above description, according to the plasma processing apparatus 100 of the exemplary embodiment, the variance in the hole inclination that might be caused by the consumption of the focus ring 8 can be reduced.

Furthermore, the present disclosure is not limited to the above-described exemplary embodiment but can be modified in various ways.

Figure 7:
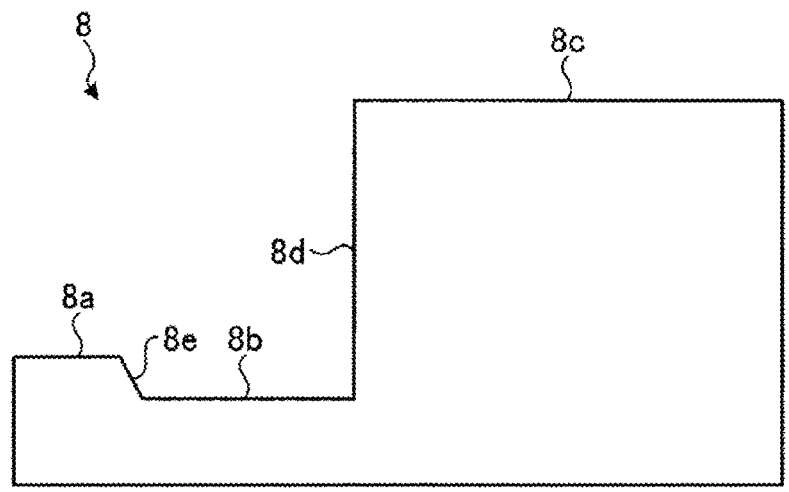
FIG. 7 is a diagram illustrating another example of a cross sectional shape of the focus ring.
Figure 8:
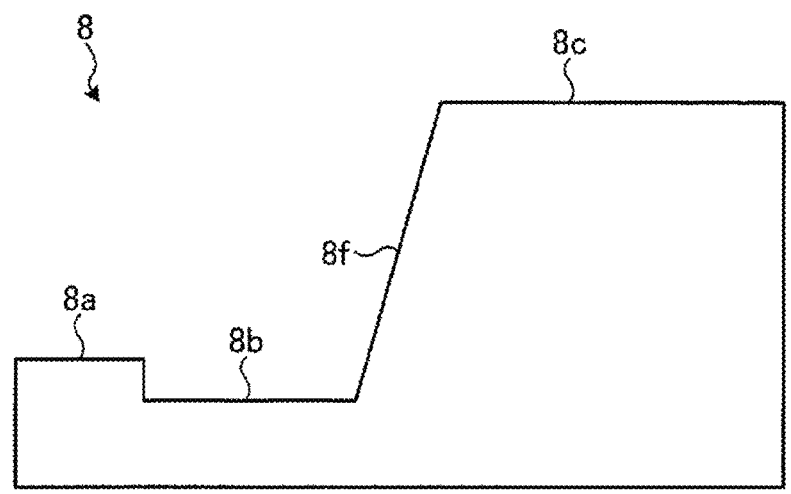
FIG. 8 is a diagram illustrating yet another example of a cross sectional shape of the focus ring.
Figure 9:
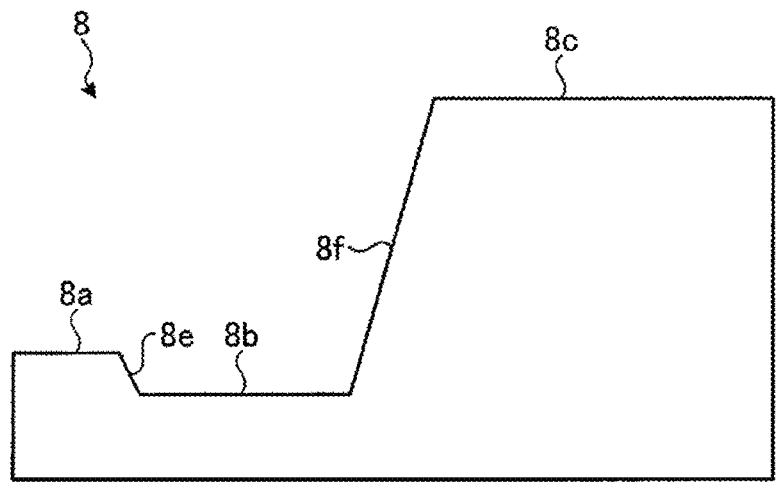
FIG. 9 is a diagram illustrating still another example of a cross sectional shape of the focus ring.

For example, the focus ring 8 may have, as other examples, cross sectional shapes as illustrated in FIG. 7 to FIG. 9. FIG. 7 to FIG. 9 are diagrams illustrating modification examples of the cross sectional shape of the focus ring 8. For instance, in the focus ring 8 shown in FIG. 7, an inclined surface 8e which descends from the inner circumferential side of the focus ring 8 toward the outer circumferential side thereof is formed between a first flat portion 8a and the second flat portion 8b. Further, as another example, in the focus ring 8 shown in FIG. 8, an inclined surface 8f which ascends from the inner circumferential side of the focus ring 8 toward the outer circumferential side thereof is formed between the second flat portion 8b and the third flat portion 8c. Moreover, as still another example, in the focus ring 8 shown in FIG. 9, the inclined surface 8e which descends from the inner circumferential side of the focus ring 8 toward the outer circumferential side thereof is formed between the first flat portion 8a and the second flat portion 8b and the inclined surface 8f which ascends from the inner circumferential side of the focus ring 8 toward the outer circumferential side thereof is formed between the second flat portion 8b and the third flat portion 8c.

Figure 10:
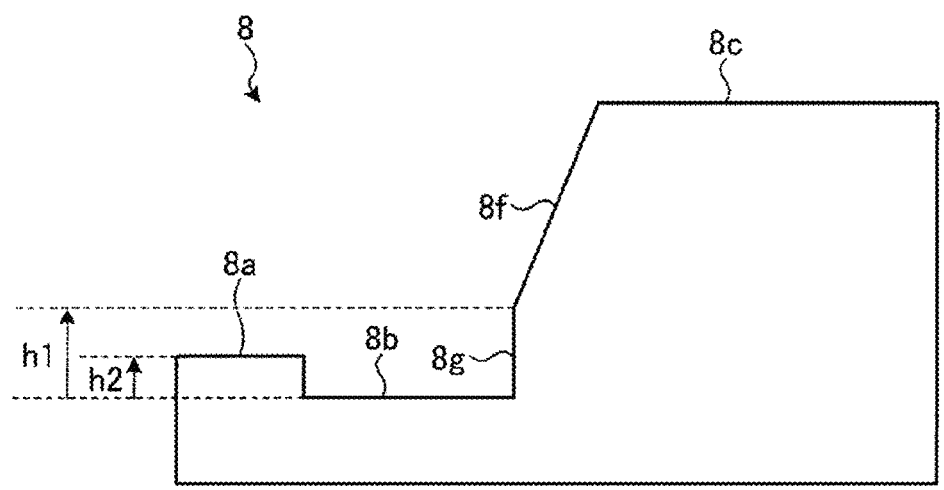
FIG. 10 is a diagram illustrating still another example of a cross sectional shape of the focus ring.

Further, as still another example, the focus ring 8 may have a cross sectional shape as illustrated in FIG. 10. FIG. 10 is a diagram showing another example of the cross sectional shape of the focus ring 8. In the focus ring 8 shown in FIG. 10, for example, a wall surface portion 8g extended from the second flat portion 8b up to a height h1 in the thickness direction of the focus ring 8 is formed between the second flat portion 8b and the third flat portion 8c. Further, the inclined surface 8f is formed between the position of the height h1 of the wall surface portion 8g and the third flat portion 8c. Moreover, in the focus ring 8 shown in FIG. 10, the height h1 of the wall surface portion 8g is higher than a height h2 from the second flat portion 8b to the first flat portion 8a. In addition, the height h1 of the wall surface portion 8g may be set to be the same as the height h2 from the second flat portion 8b to the first flat portion 8a.

Figure 11:
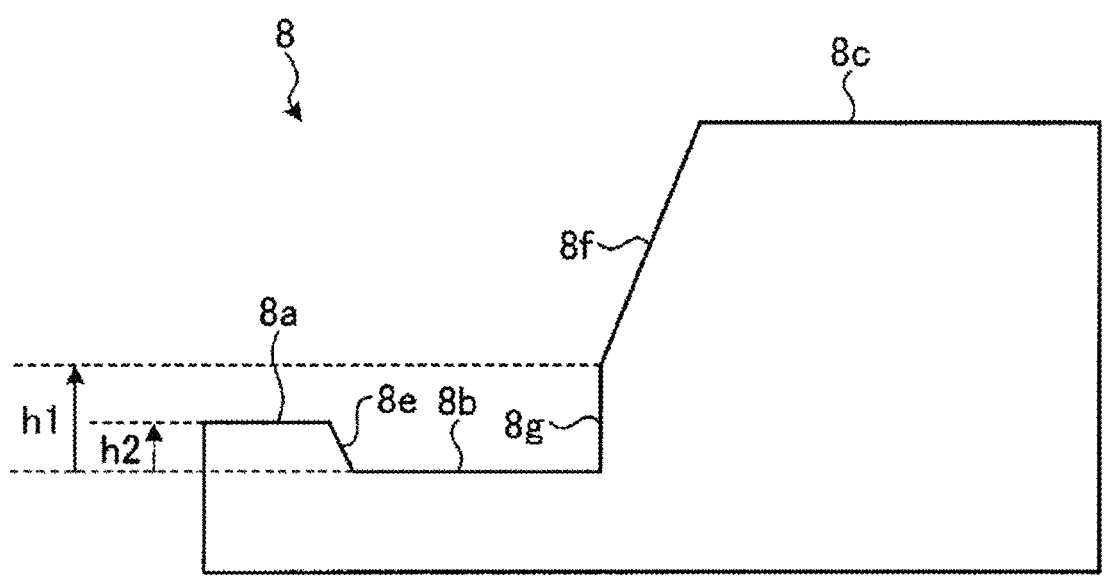
FIG. 11 is a diagram illustrating still another example of a cross sectional shape of the focus ring.

In addition, in the focus ring 8 shown in FIG. 10, the inclined surface 8e which descends from the inner circumferential side of the focus ring 8 toward the outer circumferential side thereof may also be formed between the first flat portion 8a and the second flat portion 8b, as illustrated in FIG. 11 which depicts still another example of the cross sectional shape of the focus ring 8.

Furthermore, the above exemplary embodiment has been described for the plasma processing apparatus 100 configured to perform the etching process on the semiconductor wafer W with plasma. However, the exemplary embodiment may not be limited thereto. That is, the focus ring 8 as described above can be applied to various other types of apparatus such an apparatus configured to form a film with plasma and an apparatus configured to modify a film deposited on a semiconductor wafer W with plasma, as long as the focus ring 8 has any one of cross sectional shapes as illustrated in FIG. 1 and FIG. 2, and FIG. 7 to FIG. 11.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:

1. A plasma etching apparatus, comprising:
   a chamber in which a processing target object is processed with plasma;

a mounting table, provided within the chamber, including a mounting surface on which the processing target object is mounted; and a focus ring made of a conductive material and provided to surround the processing target object mounted on the mounting surface, including a first flat portion, a second flat portion and a third flat portion which are formed in sequence from an inner circumferential side of the focus ring toward an outer circumferential side thereof, wherein the first flat portion is lower than the mounting surface, the second flat portion is lower than the first flat portion, and the third flat portion is higher than the first flat portion, the third flat portion is exposed to the plasma, a thickness of the second flat portion is smaller than a thickness of the first flat portion, a ratio of a distance from a center of the focus ring to a wall surface formed between the second flat portion and the third flat portion with respect to an inner radius of the focus ring is larger than 1.065, and a thickness of the third flat portion is equal to or larger than 2.2 times of the thickness of the first flat portion.

2. The plasma etching apparatus of claim 1,
wherein an inclined surface which declines from the inner circumferential side of the focus ring toward the outer circumferential side thereof is formed between the first flat portion and the second flat portion.

3. The plasma etching apparatus of claim 1,
wherein an inclined surface which ascends from the inner circumferential side of the focus ring toward the outer circumferential side thereof is formed between the second flat portion and the third flat portion.

4. The plasma etching apparatus of claim 3,
wherein a wall surface portion extended from the second flat portion up to a position having a first height in a thickness direction of the focus ring is formed between the second flat portion and the third flat portion, and
the inclined surface is formed between the position having the first height and the third flat portion.

5. The plasma etching apparatus of claim 4,
wherein the first height is equal to or higher than a height from the second flat portion to the first flat portion.

6. The plasma etching apparatus of claim 1,
wherein a width of the first flat portion is smaller than a width of the second flat portion in a radial direction of the focus ring.

7. The plasma etching apparatus of claim 1,
wherein a width of the second flat portion is smaller than a width of the third flat portion in a radial direction of the focus ring.

8. The plasma etching apparatus of claim 1,
wherein the third flat portion is provided at a position higher than a processing target surface of the processing target object which is mounted on the mounting table.

9. The plasma etching apparatus of claim 1,
wherein the first flat portion is provided at a position lower than the mounting surface of the mounting table.

10. The plasma etching apparatus of claim 1,
wherein the focus ring is configured to adjust a plasma sheath formed above the processing target object.

11. The plasma etching apparatus of claim 1,
wherein a width of the first flat portion is smaller than a width of the second flat portion in a radial direction, and
the width of the second flat portion is smaller than a width of the third flat portion in the radial direction.

12. A focus ring made of a conductive material and provided within a chamber, in which a processing target object is processed with plasma, and positioned to surround the processing target object mounted on a mounting surface of a mounting table, comprising:
a first flat portion lower than the mounting surface;
a second flat portion lower than the first flat portion; and
a third flat portion higher than the first flat portion,
wherein the first flat portion, the second flat portion and the third flat portion are formed in sequence from an inner circumferential side of the focus ring toward an outer circumferential side thereof,
the third flat portion is exposed to the plasma,
a thickness of the second flat portion is smaller than a thickness of the first flat portion,
a ratio of a distance from a center of the focus ring to a wall surface formed between the second flat portion and the third flat portion with respect to an inner radius of the focus ring is larger than 1.065, and
a thickness of the third flat portion is equal to or larger than 2.2 times of the thickness of the first flat portion.

13. The focus ring of claim 12,
wherein an inclined surface which declines from the inner circumferential side of the focus ring toward the outer circumferential side thereof is formed between the first flat portion and the second flat portion.

14. The focus ring of claim 12,
wherein an inclined surface which ascends from the inner circumferential side of the focus ring toward the outer circumferential side thereof is formed between the second flat portion and the third flat portion.

15. The focus ring of claim 14,
wherein a wall surface portion extended from the second flat portion up to a position having a first height in a thickness direction of the focus ring is formed between the second flat portion and the third flat portion, and
the inclined surface is formed between the position having the first height and the third flat portion.

16. The focus ring of claim 15,
wherein the first height is equal to or higher than a height from the second flat portion to the first flat portion.

17. The focus ring of claim 12,
wherein a width of the first flat portion is smaller than a width of the second flat portion in a radial direction of the focus ring.

18. The focus ring of claim 12,
wherein a width of the second flat portion is smaller than a width of the third flat portion in a radial direction of the focus ring.

19. The focus ring of claim 12,
wherein the third flat portion is provided at a position higher than a processing target surface of the processing target object which is mounted on the mounting table.

20. The focus ring of claim 12,
wherein the first flat portion is provided at a position lower than the mounting surface of the mounting table.

* * * * *